United States Patent
Osakabe et al.

(10) Patent No.: US 6,847,432 B2
(45) Date of Patent: Jan. 25, 2005

(54) ALIGNMENT SYSTEM AND PROJECTION EXPOSURE APPARATUS

(75) Inventors: Yuichi Osakabe, Utsunomiya (JP); Nobuhiro Kodachi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/677,235

(22) Filed: Oct. 3, 2003

(65) Prior Publication Data

US 2004/0070741 A1 Apr. 15, 2004

Related U.S. Application Data

(62) Division of application No. 10/337,887, filed on Jan. 8, 2003, now Pat. No. 6,683,673, which is a division of application No. 09/186,160, filed on Nov. 5, 1998, now Pat. No. 6,532,056.

(30) Foreign Application Priority Data

Nov. 10, 1997 (JP) .............................................. 9-323781

(51) Int. Cl.⁷ .......................... G03B 27/42; G03B 27/54
(52) U.S. Cl. ........................................... 355/53; 355/67
(58) Field of Search ............................. 355/53, 55, 67, 355/77; 356/399–401; 250/492.2, 492.22

(56) References Cited

U.S. PATENT DOCUMENTS

| | | | |
|---|---|---|---|
| 5,249,016 A | 9/1993 | Tanaka ........................ | 355/53 |
| 5,715,037 A | 2/1998 | Saiki et al. ................... | 355/53 |
| 5,751,404 A * | 5/1998 | Murakami et al. ............ | 355/53 |
| 5,795,687 A | 8/1998 | Yasuda ........................ | 430/22 |
| 5,978,069 A | 11/1999 | Kato ............................ | 355/53 |
| 5,995,198 A | 11/1999 | Mizutani ..................... | 355/53 |
| 5,999,244 A | 12/1999 | Yanagihara et al. .......... | 355/53 |
| 6,023,320 A | 2/2000 | Kawashima ................. | 355/53 |
| 6,198,527 B1 | 3/2001 | Nishi .......................... | 355/53 |
| 6,532,056 B2 | 3/2003 | Osakabe et al. ............. | 355/53 |

* cited by examiner

Primary Examiner—Henry Hung Nguyen
(74) Attorney, Agent, or Firm—Fitzpatrick, Cella, Harper & Scinto

(57) ABSTRACT

An alignment system for aligning a reticle having a pattern and an alignment mark with a photosensitive substrate to which the pattern of the reticle is to be transferred, is disclosed. The alignment system includes a movable substrate stage for holding the substrate, and a light-transparent plate having a mark for relative positioning with respect to at least one of the reticle and the substrate stage, wherein positioning of at least one of the reticle and the substrate stage is performed on the basis of the mark provided on the light-transparent plate.

10 Claims, 10 Drawing Sheets

ALIGNMENT SYSTEM AND PROJECTION EXPOSURE APPARATUS

This application is a divisional of U.S. patent application Ser. No. 10/337,887, filed Jan. 8, 2003, now U.S. Pat. No. 6,683,673 which is a divisional of U.S. patent application Ser. No. 09/186,160, filed Nov. 5, 1998, which issued as U.S. Pat. No. 6,532,056 on Mar. 11, 2003.

FIELD OF THE INVENTION AND RELATED ART

This invention relates to an alignment system and a projection exposure apparatus with the same. The present invention is suitably usable in a lithographic process for the manufacture of semiconductor devices or other devices such as CCDs or liquid crystal displays, for example, for lithographically transferring or imagewise projecting a pattern of a reticle or mask onto a substrate directly or through a projection optical system in a step-and-repeat or step-and-scan method.

In projection apparatuses for the manufacture of semiconductor devices, for example, increases in density of an integrated circuit have necessitated that a circuit pattern formed on a reticle be projected and printed on a wafer (substrate) with higher resolution.

At the same time, due to miniaturization of a circuit pattern, it is required that a wafer and a reticle having an electronic circuit pattern formed thereon be aligned with each other very precisely. Generally, as an alignment method for the reticle and the wafer, there is a baseline method wherein positional information about an alignment mark provided on a wafer is detected (observed) through an alignment microscope (alignment scope).

This method contains a factor for an error of reticle-to-wafer alignment, called a baseline error, which is an error related to baseline measurement.

FIG. 1A is a schematic view of a main portion of a conventional projection exposure apparatus, and FIG. 1B is a schematic view of a portion of FIG. 1A. The baseline measurement will be described briefly, with reference to these drawings.

In FIGS. 1A and 1B, a reticle 1 is held on a reticle stage 6 by attraction. The projection exposure apparatus is equipped with a reticle reference mark 19 which is positioned exactly with respect to a projection optical system 7 and which is to be used for aligning the reticle 1 with respect to a predetermined position. Second mark detecting means 18 has a detection region at a predetermined position within the projection field of the projection optical system 7, and it serves to optically detect, within this detection region, the positional relation between the reticle 1 and the reticle reference mark 19 as well as the relative positional relation between a second reticle mark 5, provided on the reticle 1, and a second reference mark 14 formed on a substrate stage 11. The second mark detecting means 18 includes moving means. By use of this second mark detecting means 18 and with reference to the reticle reference mark 19, a first reticle mark 4 provided on the reticle 1 is moved into registration with the reticle reference mark 19, and registration is measured. This is called a first measurement. On the basis of the result of this measurement, a deviation between the reticle 1 and the reticle reference mark 19 is detected.

A reference mark plate 12 is provided in a portion of the reticle stage 11, and it has formed thereon a first reference mark 13 which can be detected through first mark detecting means 17 and a second reference mark 14 which can be detected through the second mark detecting means 18. These first and second reference marks 13 and 14 are disposed with a certain interval corresponding to positions of the detecting regions of the first and second mark detecting means 17 and 18. The substrate stage 11 is moved and positioned so that the second reticle mark 5 on the reticle 1 and the second reference mark 14 on the reference mark plate 12 can be detected through the second mark detecting means 18. After such positioning, a relative positional deviation between the second reference mark 14 and the detection center of the second reticle mark 5 is measured, and the deviation is memorized as a deviation of a relative position of the reticle 1 and the substrate stage 11. This is called a second measurement.

Then, a deviation between the detection center of the first mark detecting means 17 and the first reference mark 13 on the reference plate 12 is measured. This is called a third measurement.

From the results of the first to third measurements, the relative distance between the reticle reference mark 19 and the detection center of the first mark detecting means 17 is taken as a baseline, and a relative positional deviation detected by measurement is determined as a baseline correction value.

As described, in conventional projection exposure apparatuses, first the relative position between a first reticle mark 4 of a reticle 1 and a reticle reference mark 19, positioned accurately with respect to a projection optical system 7 for alignment of the reticle 1 with respect to a predetermined position, is detected (first measurement). Second, the relative position between a second reticle mark 5 of the reticle 1 and a second reference mark 14 formed on a reference mark plate 12, provided in a portion of a substrate stage 11, is detected (second measurement). Third, the relative position between a first reference mark 13, having predetected positional relation with the first reference mark 14 on the reference mark plate 12, and the detection center of first mark detecting means 17 capable of optically detecting a mark on the substrate stage 11 and having its detection center positioned at a predetermined distance from the optical axis of the projection optical system 7, is detected (third measurement). From the results of these three detections, the distance between the detection center of the first mark detecting means 17 and the reticle reference mark 19, for alignment of the reticle with a predetermined position, is detected as a baseline, and it is memorized into a storing medium.

The baseline measurement in conventional projection exposure apparatuses is performed with the intervention of a reticle. This creates a possibility that an error of reticle patterning causes a baseline error. It necessitates preparation of reticles to be used exclusively with a particular projection exposure apparatus. This is very inconvenient. In other words, performing baseline measurement through a peculiar reticle to be used with a particular projection exposure apparatus, necessitates that the baseline measurement and stage correction measurement are executed after that reticle is loaded at a predetermined position in the exposure apparatus. This requires complicated operations for exposure apparatus control and for reticle control, and numerous operations have to be involved in the exposure apparatus operation.

Further, the relative distance between the reticle reference mark 19 and the detection center of the first mark detecting means 17 is detected as a baseline length, on the basis of the three measurements made to (i) the reticle 1 and the reticle reference mark 19, (ii) the reticle 1 and the substrate stage 11, and (iii) the substrate stage 11 and the detection center of the first mark detecting means 17. Each of these three measurements may contain a measurement error. Therefore, there is a certain limitation to precision improvement in the baseline measurement. Further, the necessity of three measurements produces a certain limitation to improvement of the baseline measurement speed.

Baseline measurement using a reticle peculiar to a particular exposure apparatus means that the baseline measurement is unattainable if a reticle loaded is different or when no reticle is loaded in the exposure apparatus. This provides a certain limitation to the reduction of operation time for baseline measurement or to baseline measurement control.

Furthermore, baseline measurement or stage running correction measurement cannot be performed if a reticle is placed at a predetermined position within the exposure apparatus. This applies an adverse effect to throughput of the whole exposure apparatus.

SUMMARY OF THE INVENTION

It is an object of the present invention to provide an improved alignment system and/or an improved projection exposure apparatus by which a baseline, that is, the relative distance between a reticle reference mark exactly positioned with respect to a projection optical system and a detection center of a first mark detecting means, for detecting positional information related to a first reference mark provided on a substrate (wafer), can be measured with a baseline measurement error factor removed or reduced, such that simplification of baseline measurement control as well as improvement of baseline measurement precision and processing speed are assured, and such that relative alignment of the reticle and the substrate can be made accurately to assure high precision projection and transfer of a pattern of the reticle onto the substrate.

It is another object of the present invention to provide an improved alignment system and/or an improved projection exposure apparatus by which, even if there is no reticle placed on a light path within an exposure apparatus, a baseline, that is, the relative distance between a reticle reference mark exactly positioned with respect to a projection optical system and a detection center of a first mark detecting means, for detecting positional information related to a first reference mark provided on a substrate (wafer), can be measured with a baseline measurement error factor removed or reduced, such that simplification of baseline measurement control as well as improvement of baseline measurement precision and processing speed are assured, and such that relative alignment of the reticle and the substrate can be made accurately to assure high precision projection and transfer of a pattern of the reticle onto the substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
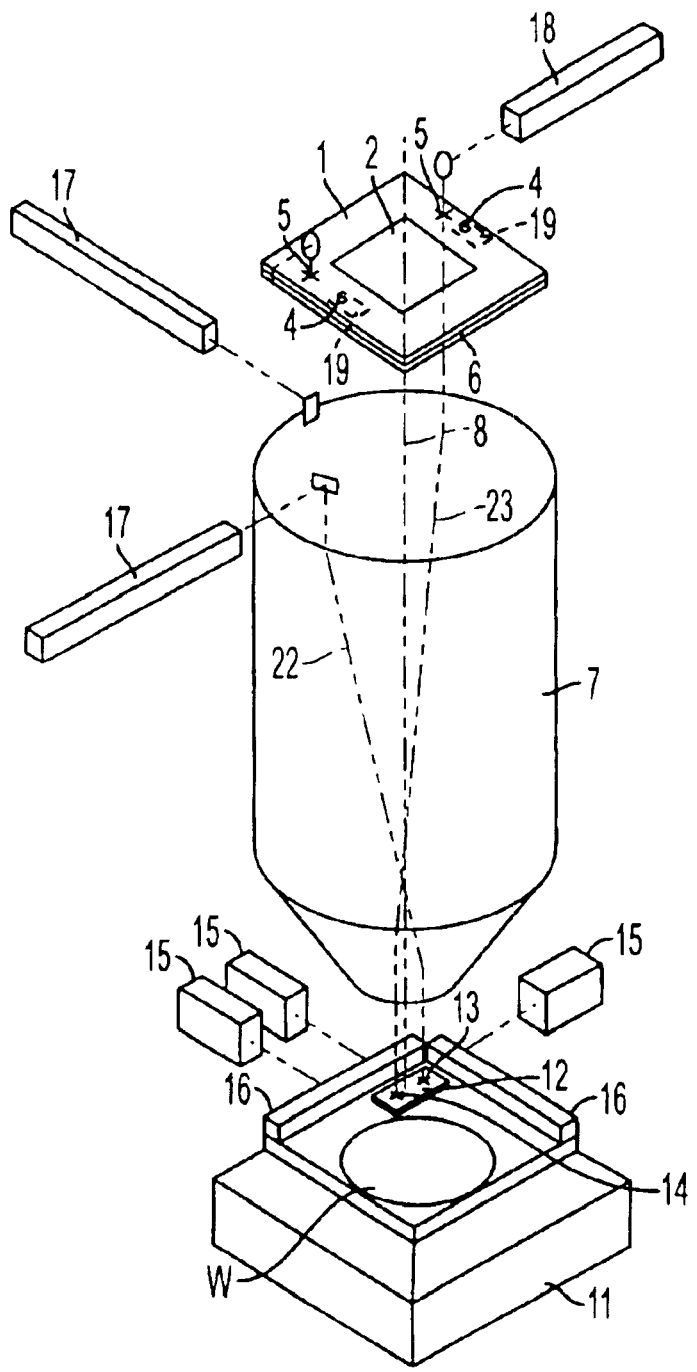
FIG. 1A is a schematic view of a main portion of a conventional projection exposure apparatus with an alignment system.
Figure 1B:
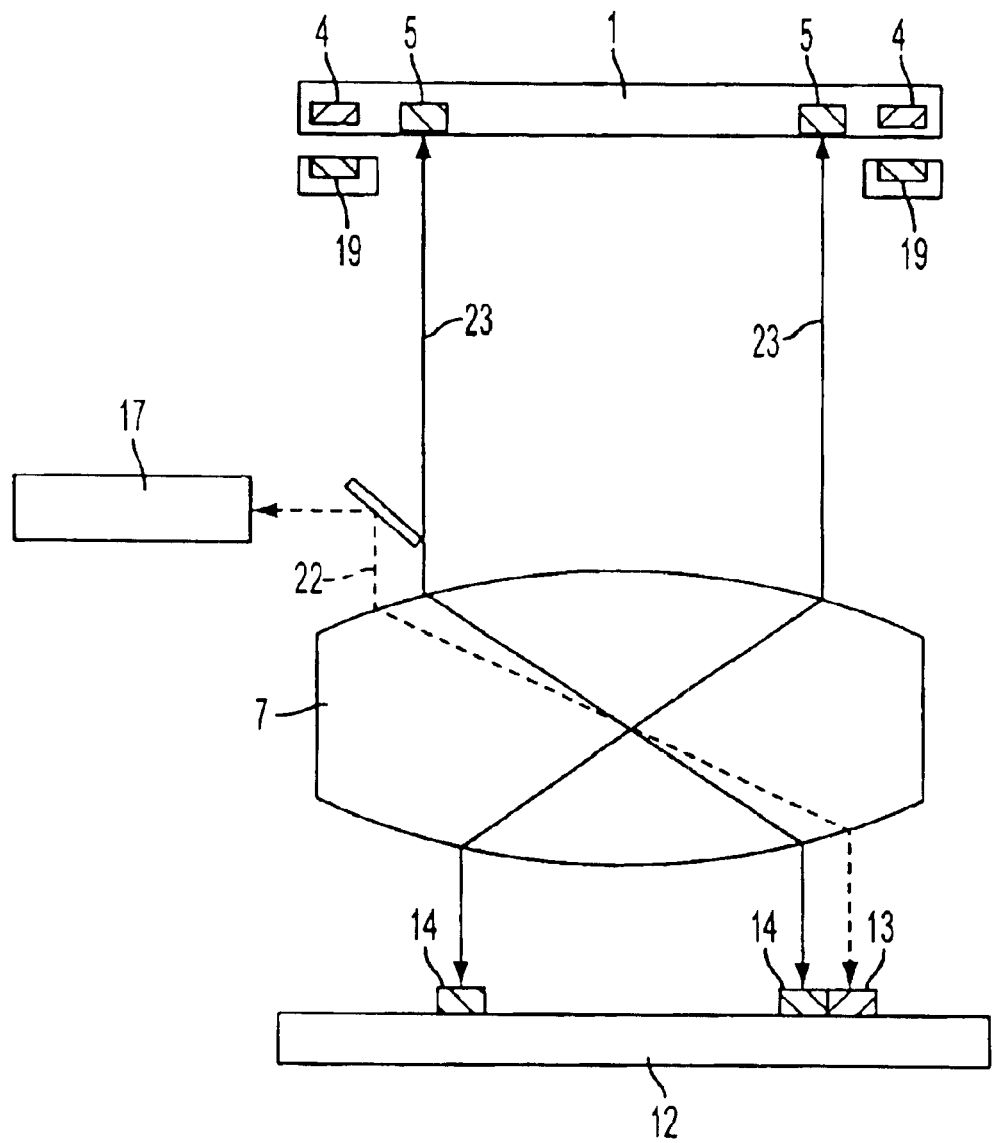
FIG. 1B is a schematic view of a portion of FIG. 1A.
Figure 2A:
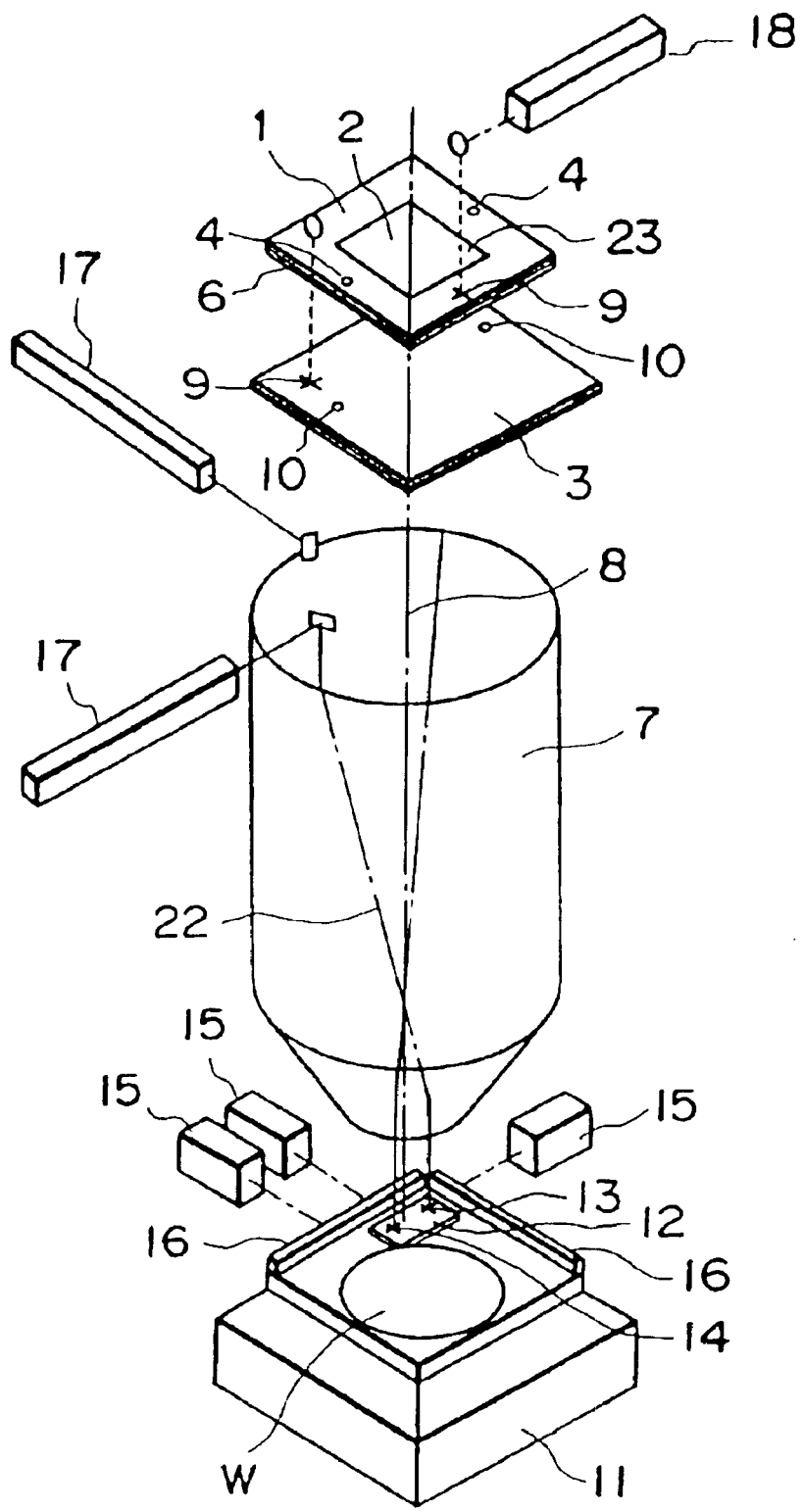
FIG. 2A is a schematic view of a main portion of a projection exposure apparatus according to a first embodiment of the present invention.
Figure 2B:
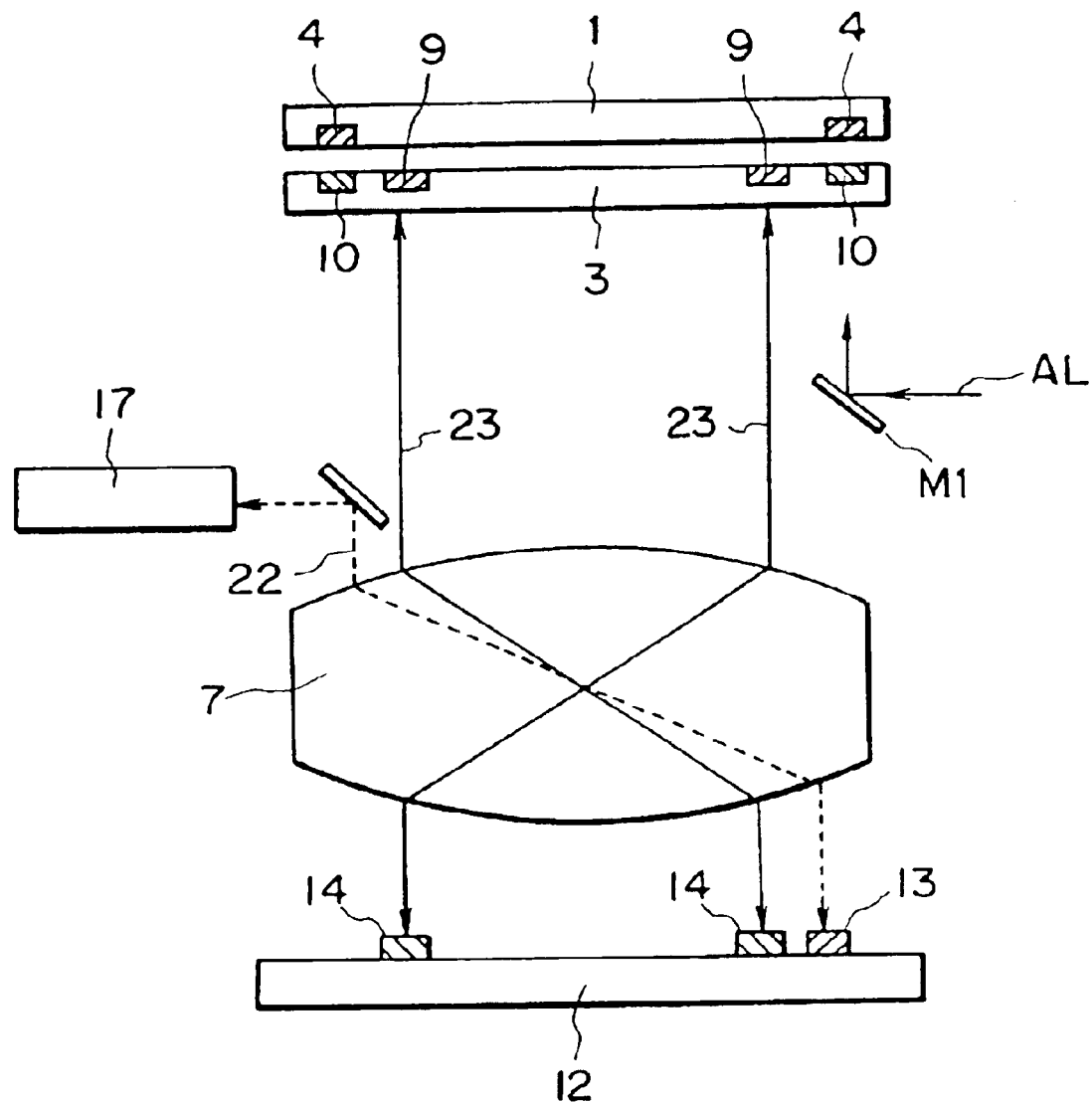
FIG. 2B is a schematic view of a portion of FIG. 2A.

FIG. 2A is a schematic view of a main portion of a projection exposure apparatus according to a first embodiment of the present invention. FIG. 2B is a schematic view of a portion of FIG. 2A. In the exposure apparatus of FIGS. 2A and 2B, the clearance between a parallel flat glass 3 and a reticle 1 is actually very small, but for illustration and for ease in understanding, it is shown as being large. In these drawings, there are two alignment systems whose components are denoted by corresponding reference numerals.

In FIG. 2A, a reticle 1 has a pattern region (reticle pattern region) 2, in which a circuit pattern to be printed on a photosensitive substrate (wafer) W is formed, and a first reticle mark 4 to be used for alignment with respect to the parallel flat glass (parallel flat member) 3 which is provided in accordance with the present embodiment. A reticle stage 6 holds the reticle 1 by attraction, and it has a structure for two-dimensional movement in the X, Y, and θ directions under control of controlling means (drive control system), for controlling a driving mechanism such as a motor, for example. Along an optical axis 8 between the reticle 1 and a projection optical system 7, the parallel flat glass 3 is fixed at a predetermined position with respect to the projection optical system 7, and it is positioned there.

The parallel flat glass 3 has marks formed thereon for positioning of the reticle, a substrate stage and a photosensitive substrate. More specifically, on the parallel flat glass 3, there are second marks 10 as index marks to be used as a reference for alignment of a first reticle mark 4 on the reticle 1, as well as first marks 9 as index marks to be used as a reference for alignment of a second reference mark 14 on a reference mark plate 12, provided in a portion of a substrate stage 11. The first and second marks 9 and 10 are formed at positions outside the incidence range of projection exposure light upon the actual device pattern surface of the reticle 1. The second marks 10 are provided symmetrically with respect to the center of the parallel flat glass 3. Thus, by these marks, the center of the marks, that is, the optical axis of the projection optical system 7 is determined. The substrate stage 11 fixedly holds a photosensitive substrate W thereon, and it is provided with control means for controlling a driving mechanism which serves to provide upward and downward motion of the photosensitive substrate surface into registration with the image plane of the projection optical system 7, image plane defocus correction drive, and rotational drive of the photosensitive substrate for control of alignment and yawing of the substrate.

Along two sides of the substrate stage 11, there are movable mirrors 16 which are fixedly provided to reflect beams from laser interferometers 15. The beams emitted from the laser interferometers 15 are perpendicular to the optical axis 8 of the projection optical system 7. By means of these laser interferometers 15, the position and movement amount of the substrate stage 11 is measured continuously. The substrate stage 11 has a reference mark plate 12 formed in a portion thereof. For alignment of the substrate stage 11 with the parallel flat glass 3, the reference mark plate 12 is provided with a first reference mark 13 which can be detected through the first mark detecting means 17, and a second reference mark 14 which can be detected through the second mark detecting means 18. The first and second reference marks 13 and 14 are provided at a certain interval corresponding to the detection regions of the first and second mark detecting means 17 and 18.

The two-dimensional perpendicularity of the reference mark plate 12 is held fixed so that it is registered, as much as possible, with the two-dimensional perpendicularity of the substrate stage 11. The first mark detecting means 17 is outside the projection field of the projection optical system 7, and it has a detection center at a position spaced by a predetermined distance from the optical axis 8 of the projection optical system 7. The first mark detecting means 17 serves as a detecting means for optically detecting marks provided on the photosensitive substrate W or on both of the substrate stage 11 and the photosensitive substrate W. The second mark detecting means 18 serves to optically detect a relative positional relation of marks provided on the reticle 1, the parallel flat glass 3 and the substrate stage 11. It has a detection region at a predetermined position within the projection field of the projection optical system 7. It includes moving means.

FIG. 2B is a schematic view for explaining reticle alignment measurement, baseline measurement and substrate stage running correction, in the exposure apparatus according to this embodiment of the present invention.

First, reticle alignment measurement in the exposure apparatus will be explained in detail.

Initially, alignment illumination light AL emitted from an alignment light source (not shown) goes along a light transmission path, having flexibility, and it is projected on the second mark 10 of the parallel flat glass 3 from the projection optical system 7 side. The parallel flat glass 3 is positioned and mounted on the projection optical system 7 precisely. Detection illumination light AL passing the second alignment mark 10 illuminates the first reticle mark 4 on the reticle 1. Detection light passing the first reticle mark 4 goes through a detection optical system, and it is received by a camera which serves to convert a detection signal into an imagewise signal. An alignment mark image 4a thus taken is converted into a video signal. Then, image processing is performed, and the amount of relative deviation between the reticle 1 and the mark position of the parallel flat glass 3 is detected. The thus detected deviation of the reticle 1 is then processed by a calculating means, and the result is stored into a storing medium. From the result of calculation processing made to the deviation of the reticle 1, the amount of corrective drive for the reticle is calculated, and the result is applied to the driving mechanism (second positioning means) of the reticle stage 6 on which the reticle is held by attraction. Thus, reticle stage correcting operation is performed, whereby the reticle position is corrected.

Here, the second mark detecting means 18 is positioned by use of second positioning means so that the second mark 10 of the parallel glass plate 3 is registered, upon the processing picture image, with the first reticle mark 4, that is, the reticle and the parallel flat glass are aligned with each other.

Next, baseline measurement in the exposure apparatus of this embodiment of the present invention will be described in detail.

In the exposure apparatus according to this embodiment of the present invention, the baseline length can be determined through a calculation operation for results of two measurement operations.

A first measurement is a measurement for detecting the relative positional relation between the parallel flat glass 3 and the reference mark plate 12 on the substrate stage 11. Details of this measurement is as follows. The second mark detecting means 18 placed above the reticle 1 and the substrate stage 11 are moved by a driving mechanism (first position means) to a predetermined station for baseline measurement, and focusing drive for the parallel flat glass 3 and the reference mark plate 12 is performed. Then, by means of the second mark detecting means 18, a relative positional deviation between the detection center of the first mark 9 on the parallel flat glass 3 and the second reference mark 14 on the reference mark plate 12 is detected.

The thus detected deviation is memorized into a storing medium, as a relative positional deviation between the parallel flat glass 3 and the reference mark plate 12. Here, the reticle 1 has been aligned with respect to a predetermined position through the reticle alignment measurement described hereinbefore, and for the baseline measurement the first mark 9 on the parallel flat glass 3 has been positioned below the transmissive pattern of the reticle 1. Thus, detection light 23 from above the reticle passes through the transmissive pattern of the reticle and it illuminates the first mark 9 on the parallel flat glass 3.

A second measurement is a measurement for detecting the relative positional relation between the reference mark plate 12 on the substrate stage 11 and the detection center of the first mark detecting means 17. Details of this measurement is as follows. After completion of the first measurement, the substrate stage 11 is moved in the optical axis direction of the projection optical system 7 by a small amount, and focusing of the first reference mark 13 of the reference mark plate 12 and the detection center of the first mark detecting means 17 is performed. Then, by using the first mark detecting means 17, a relative positional deviation between the detection center of the first mark detecting means 17 and the first reference mark 13 on the reference mark plate 12 is detected. The detected deviation is stored into a storing medium.

The first measurement and second measurement are repeated by predetermined times. Thereafter, a calculation operation is performed within the storing medium, and a calculation value concerning the relative positional deviation between the detection center of the first mark detecting means 17 and the first mark 9 of the parallel flat glass 3 is produced. The thus obtained relative positional deviation Δ is stored into the storing medium, as a baseline error.

Here, the baseline error corresponds to a relative differential distance between the center of detection of the first mark 9 and a scope reference mark defined within the first mark detecting means 17.

For the baseline measurement, running correction of the substrate stage 11 with respect to the parallel flat glass 3 has to be completed beforehand. The running correction for the substrate stage 11 will be described below, in detail.

Initially, the second mark detecting means 18 and the substrate stage 11 are moved to a station where the second reference mark 14 formed on the reference mark plate 12 and the first mark formed on the parallel flat glass 3 can be detected through the second mark detecting means 18. After the second mark detecting means 18 and the substrate stage 11 are moved to the mark detection enabling position, a relative positional deviation between these marks is measured. This measurement is repeated by predetermined times, and an average of running tilt deviations of the substrate stage 11 with respect to the parallel flat glass 3 is calculated. The result is stored into a storing medium.

From the running tilt deviation of the substrate stage 11 with respect to the parallel flat glass 3 and from the positional deviation of the reticle 1 with respect to the parallel flat glass 3, as detected through the reticle alignment measurement, a running tilt of the substrate stage 11 with respect to the reticle 1 through the parallel flat glass can be calculated. The value of the calculation thus obtained is put into the storing medium, and a correction value determined by calculation is stored in a control storing medium as an offset for running deviation of the substrate stage 11.

Here, by using the second mark detecting means 18 and by using the first mark 9 of the parallel flat glass 3 and the second reference mark 14 of the substrate stage 11, relative alignment of the parallel flat glass 3 and the substrate stage 11 is accomplished. This is first positioning means.

An exposure apparatus with an alignment system according to this embodiment of the present invention includes a control mechanism (first positioning means and second positioning means) for performing corrective drive of the substrate stage 11 and the reticle 1 on the basis of the results of measurement of positional deviations as described above. Thus, the substrate stage 11 and the reticle 1 can be moved through correction drive to appropriate positions, respectively. Namely, the reticle 1 can be aligned with respect to the parallel flat glass 3 by means of the reticle stage 6. With respect to the thus positioned reticle 1, the wafer W whose alignment mark can be detected by the first mark detecting means can be aligned while taking into account the baseline error (and/or running deviation). By these processes, each wafer shot position can be correctly positioned with respect to the exposure area.

Figure 3:
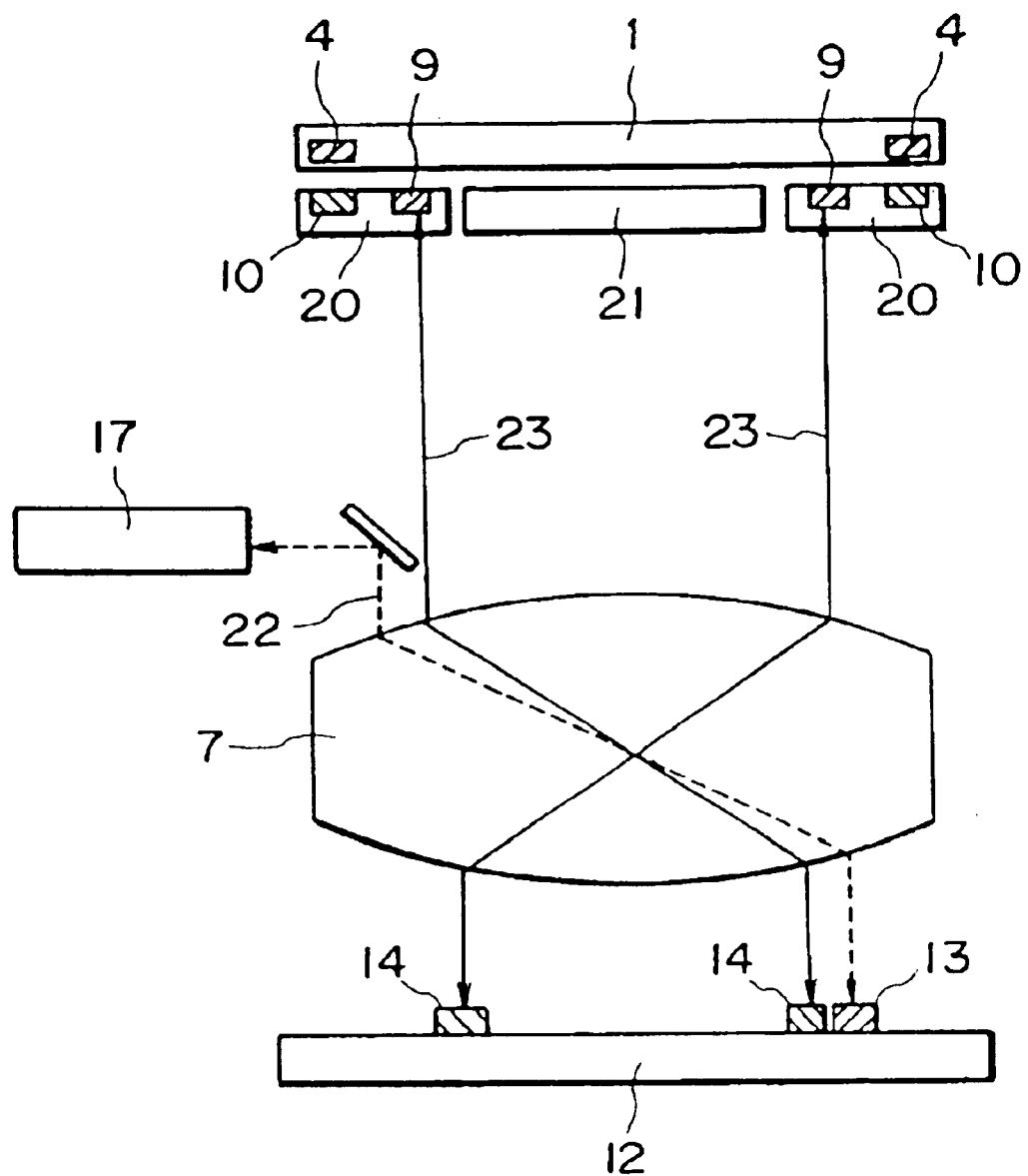
FIG. 3 is a schematic view for explaining reticle alignment measurement, baseline measurement and substrate stage running correction, in an exposure apparatus according to an embodiment of the present invention.

The parallel flat glass 3 to be used in the exposure apparatus may be of an integral type as shown in FIG. 2B, but alternatively, it may be of a separate structure such as shown in FIG. 3 wherein it comprises a parallel flat glass peripheral portion 20 having marks formed thereon and a parallel flat glass central portion 21 positioned at the optical axis of the projection optical system 7. When the parallel flat glass is separated into a peripheral mark portion and a central optical axis portion, as above, the optical influence to an actual device pattern portion to be exposed just below the projection optical system due to insertion of a parallel flat glass member can be removed or reduced, through adjustment of the parallel flat glass central portion 21. Further, a small thermal deformation of the parallel flat glass to be produced by absorption of illumination light by a mark on the parallel flat glass, can be reduced by separation of the exposure central portion and the mark portion. Therefore, any distortion of an exposure pattern due to a small thermal deformation of the parallel flat glass can be prevented.

In accordance with this embodiment of the present invention as described above, a projection exposure apparatus may comprise a movable reticle stage for holding a reticle or photomask having a pattern to be exposed and plural alignment marks, a movable substrate stage for holding a photosensitive substrate onto which the pattern of the reticle is to be printed, a projection optical system for imagewise projecting the pattern of the reticle in a projection region upon the photosensitive substrate, and a parallel flat glass disposed between the reticle and the projection optical system and having marks for positioning of the reticle, the substrate stage and the photosensitive substrate. With this arrangement, baseline measurement can be done without intervention of the reticle. As a result, an error of baseline measurement due to a reticle patterning error can be removed, such that the substrate can be aligned with respect to a predetermined position very precisely. The pattern of the reticle can then be projected and printed on the wafer and, through a subsequent development process, devices can be produced.

Figure 4:
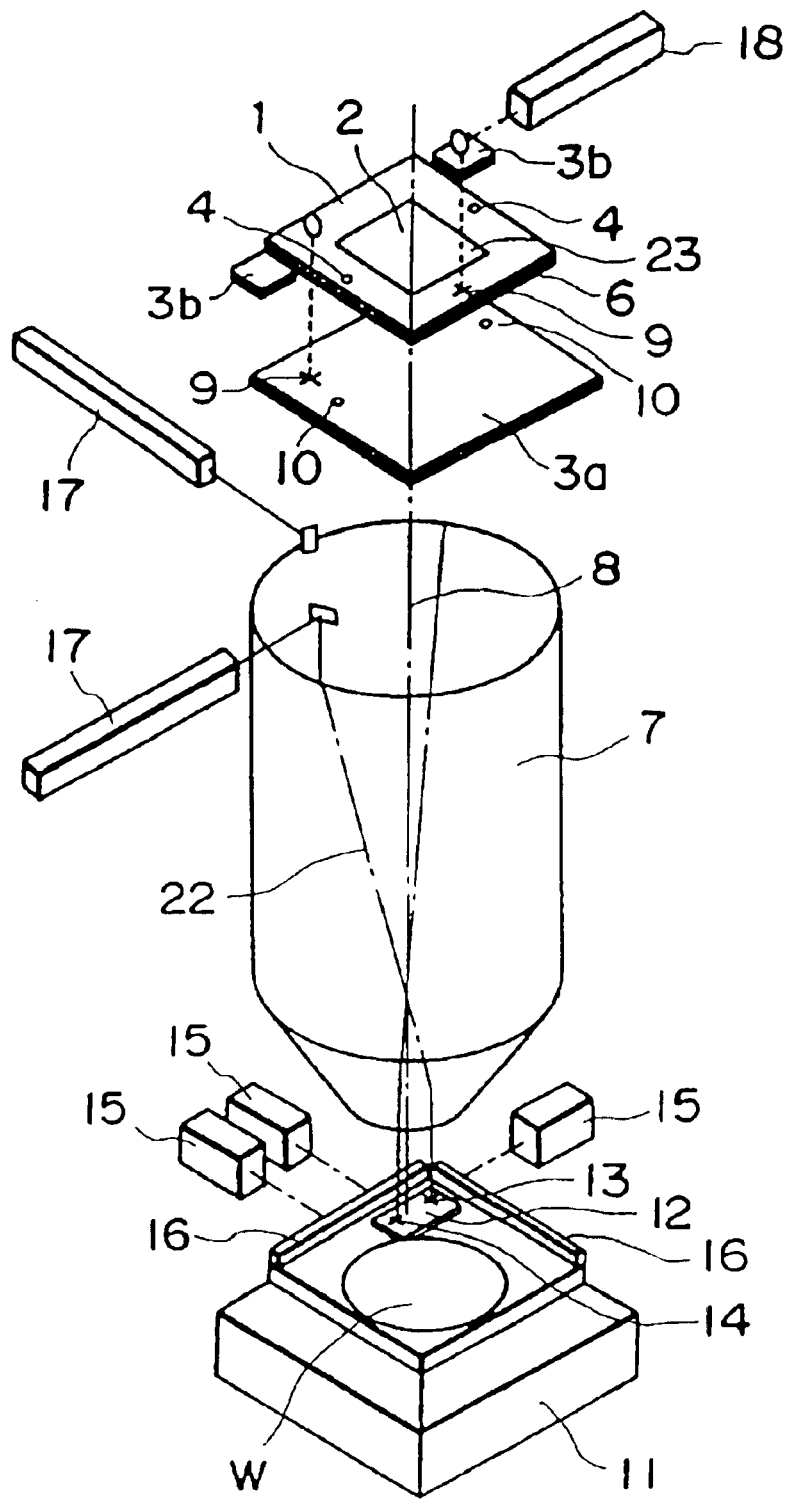
FIG. 4 is a schematic view of a main portion of a projection exposure apparatus according to a second embodiment of the present invention.
Figure 5:
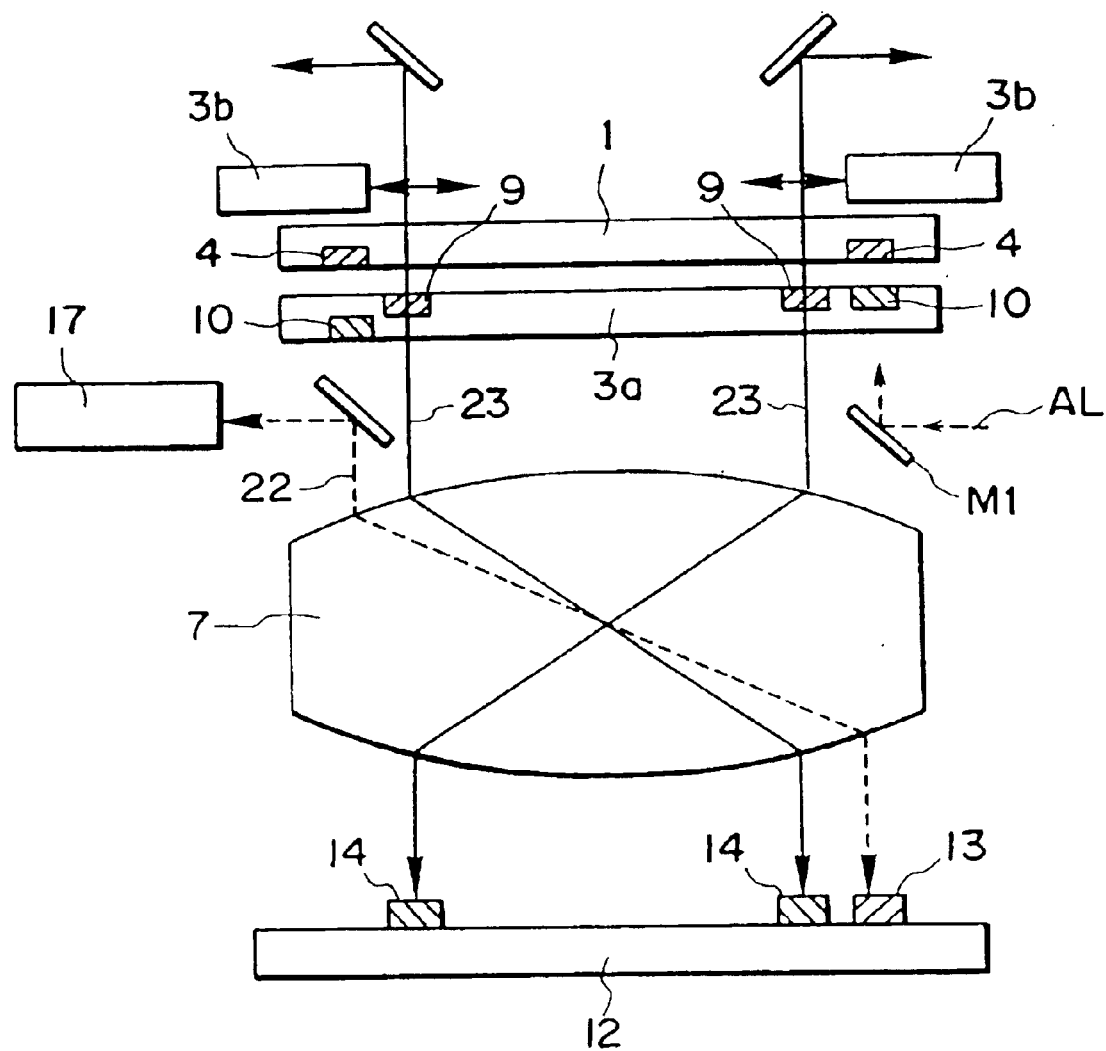
FIG. 5 is a schematic view of a portion of FIG. 4.

FIG. 4 is a schematic view of a main portion of a projection exposure apparatus according to a second embodiment of the present invention. FIG. 5 is a schematic view of a portion of FIG. 4.

This embodiment differs from the first embodiment of FIG. 2A in the following points. A first parallel flat glass 3a (corresponding to the glass 3 of FIG. 2A) having marks for positioning of a reticle 1, a substrate stage 11 and a photosensitive substrate W, is provided on an optical axis between the reticle and the projection optical system, while a second parallel flat glass with moving means is provided above the reticle and on the mark detection light path for the first parallel flat glass 3a. With this arrangement, for baseline measurement, the baseline can be measured without intervention of the reticle 1 and irrespective of whether a reticle is present across the mark detection light path. This enables that a baseline measurement error resulting from a reticle patterning error is removed and, additionally, that baseline measurement and substrate stage correction measurement are performed even when no reticle is loaded in the exposure apparatus. Thus, the throughput of the whole exposure apparatus can be improved. The structure of the remainder is essentially the same as that of the first embodiment.

The structure of this embodiment will be described in detail, although it may be partially duplicate.

In the exposure apparatus of FIGS. 4 and 5, the clearance between a parallel flat glass 3 and a reticle 1 is actually very small, but for illustration and for ease in understanding, it is shown as being large. In these drawings, there are two alignment systems whose components are denoted by corresponding reference numerals.

In FIG. 4, a reticle 1 has a pattern region (reticle pattern region) 2, in which a circuit pattern to be printed on a photosensitive substrate (wafer) W is formed, and a first reticle mark 4 to be used for alignment with respect to a first parallel flat glass 3a which is provided in accordance with this embodiment of the present embodiment. A reticle stage 6 holds the reticle 1 by attraction, and it has a structure for two-dimensional movement in the X Y and θ directions under control of controlling means (drive control system), for controlling a driving mechanism such as a motor, for example. Along an optical axis 8 between the reticle 1 and a projection optical system 7, the first parallel flat glass 3a is fixed at a predetermined position with respect to the projection optical system 7, and it is positioned there.

The first parallel flat glass 3a has marks formed thereon for positioning of the reticle, a substrate stage and a photosensitive substrate. More specifically, on the first parallel flat glass 3a there are second marks 10 as index marks to be used as a reference for alignment of a first reticle mark 4 on the reticle 1, as well as first marks 9 as index marks to be used as a reference for alignment of a second reference mark 14 on a reference mark plate 12, provided in a portion of a substrate stage 11.

The first and second marks 9 and 10 are formed at positions outside the incidence range of projection exposure light upon the actual device pattern surface of the reticle 1. The substrate stage 11 fixedly holds a photosensitive substrate W thereon, and it is provided with a driving mechanism which serves to provide upward and downward motion of the photosensitive substrate surface into registration with the image plane of the projection optical system 7, image plane defocus correction drive, and rotational drive of the photosensitive substrate for control of alignment and yawing of the substrate.

Along two sides of the substrate stage 11, there are movable mirrors 16 which are fixedly provided to reflect beams from laser interferometers 15. The beams emitted from the laser interferometers 15 are perpendicular to the optical axis 8 of the projection optical system 7. By means of these laser interferometers 15, the position and movement amount of the substrate stage 11 is measured continuously. The substrate stage 11 has a reference mark plate 12 fixedly formed in a portion thereof. For alignment of the substrate stage 11 with the first parallel flat glass 3a, the reference mark plate 12 is provided with a first reference mark 13 which can be detected through the first mark detecting means 17, and a second reference mark 14 which can be detected through the second mark detecting means 18. The first and second reference marks 13 and 14 are provided at a certain interval corresponding to the detection regions of the first and second mark detecting means 17 and 18.

The two-dimensional perpendicularity of the reference mark plate 12 is held fixed so that it is registered, as much as possible, with the two-dimensional perpendicularity of the substrate stage 11. The first mark detecting means 17 is outside the projection field of the projection optical system 7, and it has a detection center at a position spaced by a predetermined distance from the optical axis 8 of the projection optical system 7. The first mark detecting means 17 serves as a detecting means for optically detecting marks provided on the photosensitive substrate W or on both of the substrate stage 11 and the photosensitive substate W. The second mark detecting means 18 serves to optically detect a relative positional relation of marks provided on the reticle 1, the first parallel flat glass 3a and the substrate stage 11. It has a detection region at a predetermined position within the projection field of the projection optical system 7. It includes moving means.

Additionally, there is a second parallel flat glass 3b with moving means, which is disposed above the reticle 1 and on the path of detection light 23 of the second mark detecting means. The second parallel flat glass 3b is inserted by a drive control system therefor, to a position above the reticle 1 and on the path of detection light 23 of the second mark detecting means when the reticle 1 is not placed on the path of detection light 23 of the second mark detecting means. When, on the other hand, reticle 1 is placed on the path of detection light 23 of the second mark detecting means, the second parallel flat glass is moved out of the projection field and out of the path of detection light 23 of the second mark detecting means, by means of the drive control system for the second parallel flat glass 3b.

FIG. 5 is a schematic view for explaining reticle alignment measurement, baseline measurement and substrate stage running correction, in the exposure apparatus according to this embodiment of the present invention.

First, reticle alignment measurement in the exposure apparatus will be explained in detail.

Initially, alignment illumination light AL emitted from an alignment light source (not shown) goes along a light transmission path, having flexibility, and it is projected on the second mark 10 of the first parallel flat glass 3a from the projection optical system 7 side. The first parallel flat glass 3a is positioned and mounted on the projection optical system 7 precisely. Detection illumination light AL passing the second alignment mark 10 illuminates the first reticle mark 4 on the reticle 1. Detection light passing the first reticle mark 4 goes through a detection optical system, and it is received by a camera which serves to convert a detection signal into an imagewise signal. An alignment mark image 4a thus taken is converted into a video signal. Then, image processing is performed, and the amount of relative deviation between the reticle 1 and the mark position of the first parallel flat glass 3a is detected. The thus detected deviation of the reticle 1 is then processed by a calculating means, and the result is stored into a storing medium. From the result of calculation processing made to the deviation of the reticle 1, the amount of corrective drive for the reticle is calculated, and the result is applied to the driving mechanism (second positioning means) of the reticle stage 6 on which the reticle is held by attraction. Thus, a reticle stage correction operation is performed, whereby the reticle position is corrected.

Next, baseline measurement in the exposure apparatus of this embodiment of the present invention will be described in detail.

In the exposure apparatus according to this embodiment of the present invention, the baseline length can be determined through a calculation operation for results of two measurement operations.

A first measurement is a measurement for detecting the relative positional relation between the first parallel flat glass 3a and the reference mark plate 12 on the substrate stage 11. Details of this measurement is as follows. When there is a reticle 1 on the path of detection light 23 of the second mark detecting means, the second mark detecting means 18 placed above the reticle 1 and the substrate stage 11 are moved by a driving mechanism (first positioning means) to a predetermined station for baseline measurement, and focusing drive for the parallel flat glass 3a and the reference mark plate 12 is performed. Then, by means of the second mark detecting means 18, a relative positional deviation between the detection center of the first mark 9 on the first parallel flat glass 3a and the second reference mark 14 on the reference mark plate 12 is detected.

The thus detected deviation is memorized into a storing medium, as a relative positional deviation between the first parallel flat glass 3a and the reference mark plate 12. Here, the reticle 1 has been aligned with respect to a predetermined position through the reticle alignment measurement described hereinbefore, and for the baseline measurement the first mark 9 on the first parallel flat glass 3a has been positioned below the transmissive pattern of the reticle 1. Thus, detection light 23 from above the reticle passes through the transmissive pattern of the reticle and it illuminates the first mark 9 on the first parallel flat glass 3a.

When there is no reticle 1 on the path of detection light 23 of the second mark detecting means, the second mark detecting means 18 and the substrate stage 11 are moved to a predetermined station for baseline measurement, and focusing of the first parallel flat glass 3a and the reference mark plate 12 is performed. By means of the second mark detecting means 18, a relative positional deviation between the first mark 19 on the first parallel flat glass 3a and the second reference mark 14 on the reference mark plate 12 is detected. The thus detected deviation is stored into a storing medium, as a relative positional deviation between the first parallel flat glass 3a and the reference mark plate 12. Here, as the detection light 23 of the second mark detecting means passes the second parallel flat glass 3b, any optical influence to be produced as a result of not passing through the reticle 1 can be removed or reduced.

Figure 6:
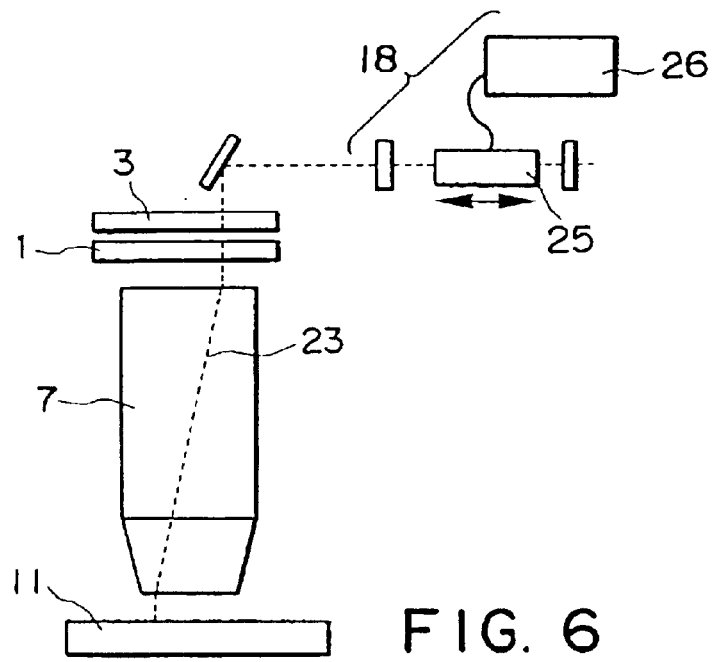
FIG. 6 is a schematic view of a main portion of a projection exposure apparatus according to a third embodiment of the present invention.

Further, the first measurement described above may be performed by use of the arrangement of second mark detecting means 18 such as shown in FIG. 6. In accordance with the arrangement of second mark detecting means 18 shown in FIG. 6, a first lens 25 and a drive control means 26 having a driving mechanism and a drive control system are provided within the second mark detecting means 18. When no reticle is present on the path of detection light 23 of the second mark detecting means, the first lens is moved to a position effective to correct any optical influence to the detection light 23 of the second mark detecting means, due to absence of the reticle. When, on the other hand, a reticle is present on the path of detection light 23 of the second mark detecting means, the first lens is moved to a position effective to correct any optical influence to the detection light 23 of the second mark detecting means due to presence of the reticle. With this structure, as a result, substantially the same optical correction effect as attainable with the exposure apparatus of FIG. 4 with a second parallel flat glass 3b, is accomplished.

A second measurement is a measurement for detecting the relative positional relation between the reference mark plate 12 on the substrate stage 11 and the detection center of the first mark detecting means 17. Details of this measurement is as follows. After completion of the first measurement, the substrate stage 11 is moved in the optical axis direction of the projection optical system 7 by a small amount, and focusing of the first reference mark 13 of the reference mark plate 12 and the detection center of the first mark detecting means 17 is performed. Then, by using the first mark detecting means 17, a relative positional deviation between the detection center of the first mark detecting means 17 and the first reference mark 13 on the reference mark plate 12 is detected. The detected deviation is stored into a storing medium.

The first measurement and second measurement are repeated by predetermined times. Thereafter, a calculation operation is performed within the storing medium and a calculation value concerning the relative positional deviation between the detection center of the first mark detecting means 17 and the first mark 9 of the first parallel flat glass 3a is produced. The thus obtained relative positional deviation Δ is stored into the storing medium, as a baseline error.

For the baseline measurement, running correction of the substrate stage 11 with respect to the first parallel flat glass 3a has to be completed beforehand. The running correction for the substrate stage 11 will be described below, in detail.

Initially, the second mark detecting means 18 and the substrate stage 11 are moved to a station where the second reference mark 14 formed on the reference mark plate 12 and the first mark 9 formed on the first parallel flat glass 3a can be detected through the second mark detecting means 18. After the second mark detecting means 18 and the substrate stage 11 are moved to the mark detection enabling position, a relative positional deviation between these marks is measured. This measurement is repeated by predetermined times, and an average of running tilt deviations of the substrate stage 11 with respect to the first parallel flat glass 3a is calculated. The result is stored into a storing medium.

From the running tilt deviation of the substrate stage 11 with respect to the first parallel flat glass 3a and from the positional deviation of the reticle 1 with respect to the first parallel flat glass 3a, as detected through the reticle alignment measurement, a running tilt of the substrate stage 11 with respect to the reticle 1 through the first parallel flat glass 3a can be calculated. The value of the calculation thus obtained is put into the storing medium, and a correction value determined by the calculation is stored in a control storing medium as an offset for running deviation of the substrate stage 11.

Here, the reticle 1 has been aligned with respect to a predetermined position through the reticle alignment measurement described hereinbefore, and for the baseline measurement the first mark 9 on the first parallel flat glass 3a has been positioned below the transmissive pattern of the reticle 1. Thus, detection light 23 from above the reticle 1 passes through the transmissive pattern of the reticle 1 and it illuminates the first mark 9 on the first parallel flat glass 3a.

When there is no reticle 1 on the path of detection light 23 of the second mark detecting means, similarly to the baseline measurement described, the second parallel flat glass 3b is moved to the path of the second mark detection light 23, so that the second mark detection light 23 goes through the second parallel flat glass 3b. By this, any optical influence to be produced by not passing the reticle 1 can be removed or reduced.

In a case where the exposure apparatus of FIG. 5 is equipped with a second mark detecting means 18 of the structure of FIG. 6, when there is no reticle 1 on the path of detection light 23 of the second mark detecting means, the first lens is moved to a position effective to correct any optical influence to the detection light 23 of the second mark detecting means, due to absence of the reticle. When, on the other hand, a reticle is present on the path of detection light 23 of the second mark detecting means, the first lens is moved to a position effective to correct any optical influence to the detection light 23 of the second mark detecting means due to presence of the reticle. With this structure, as a result, substantially the same optical correction effect as attainable with the exposure apparatus with a second parallel flat glass 3b, is accomplished.

The exposure apparatus according to this embodiment of the present invention is provided with a control mechanism for performing corrective drive of the substrate stage and the reticle stage on the basis of the results of these positional deviation measurements. Therefore, the substrate stage and the reticle stage can be moved by corrective drive to appropriate positions.

It is to be noted that the exposure apparatus of FIG. 4 is equipped with a control mechanism for performing corrective drive of the second parallel flat glass 3b to an appropriate position for optical correction described above.

Also, the exposure apparatus of FIG. 6 is equipped with a control mechanism for performing corrective drive of the first lens with moving means within the second mark detecting means to an appropriate position for optical correction described above.

Figure 7:
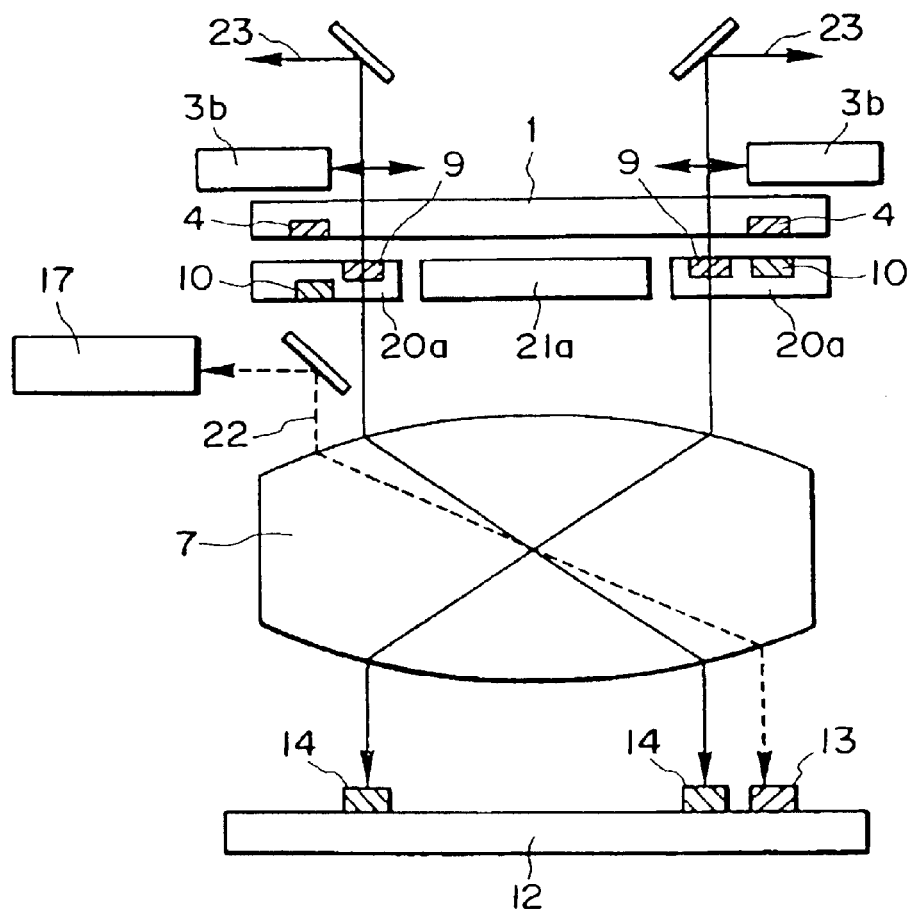
FIG. 7 is a schematic view of a portion of FIG. 6.

The first parallel flat glass 3a to be used in the exposure apparatus in accordance with the present invention may be of an integral type as shown in FIG. 5, but alternatively, it may be of a separate structure such as shown in FIG. 7 wherein it comprises a parallel flat glass peripheral portion 20a having marks formed thereon and a parallel flat glass central portion 21a positioned at the optical axis of the projection optical system 7. When the first parallel flat glass 3a is separated into a peripheral mark portion and a central optical axis portion, as above, the optical influence to an actual device pattern portion to be exposed just below the projection optical system due to insertion of a parallel flat glass member can be removed or reduced, through adjustment of the central portion of the first parallel flat glass 3a. Further, a small thermal deformation of the first parallel flat glass to be produced by absorption of illumination light by a mark on the first parallel flat glass, can be reduced by separation of the exposure central portion and the mark portion. Therefore, any distortion of the exposure pattern due to a small thermal deformation of the first parallel flat glass 3a can be prevented.

Next, an embodiment of a device manufacturing method which uses a projection exposure apparatus and/or an alignment system such as described hereinbefore, will be explained.

Figure 8:
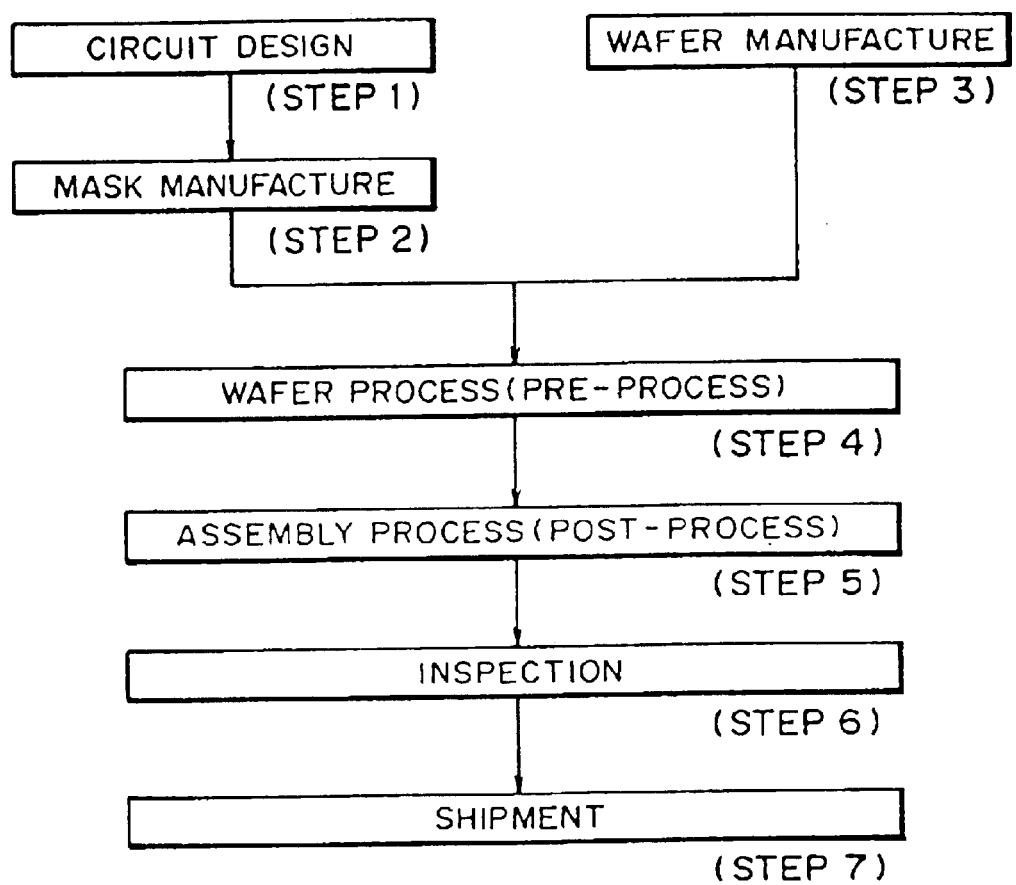
FIG. 8 is a flow chart of device manufacturing processes in an embodiment of the present invention.

FIG. 8 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
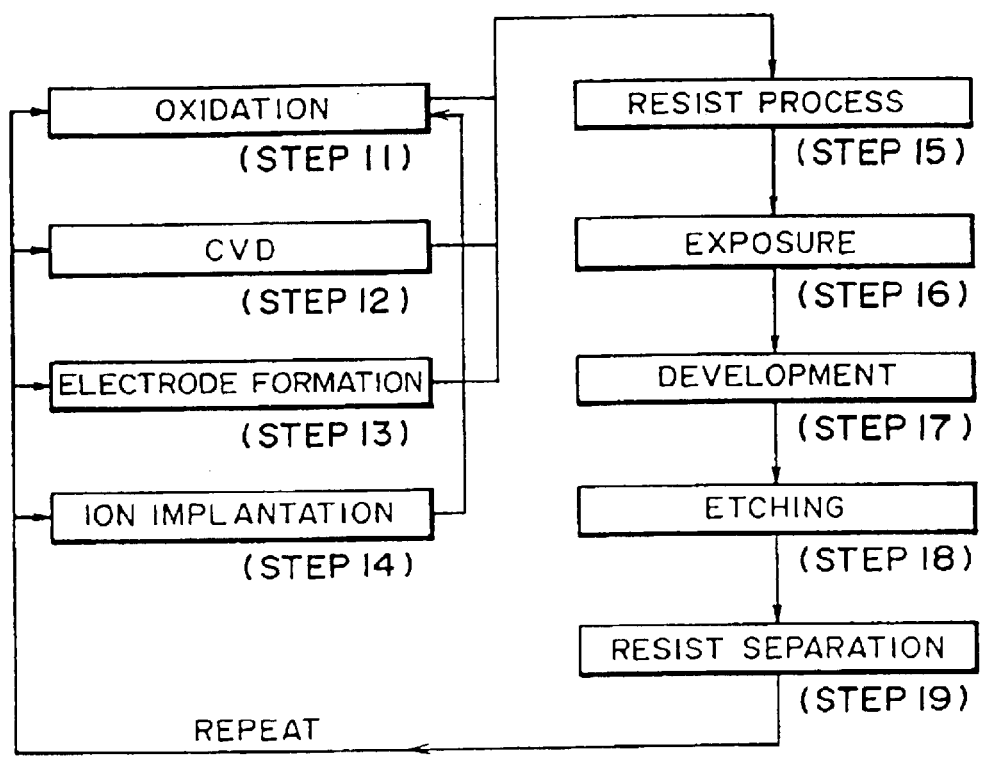
FIG. 9 is a flow chart of a wafer process.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, the baseline between a reticle reference mark exactly positioned with respect to a projection optical system and a detection center of a first mark detecting means, for detecting positional information related to a first reference mark provided on a substrate (wafer), can be measured with a baseline measurement error factor removed or reduced, such that simplification of baseline measurement control as well as improvement of baseline measurement precision and processing speed are assured. Therefore, in an alignment system and/or a projection exposure apparatus according to any of these embodiments of the present invention, relative alignment of the reticle and the substrate can be made accurately, and high precision projection and transfer of a pattern of the reticle onto the substrate is assured.

Further, even if there is no reticle on the path in an exposure apparatus, use of a second parallel flat glass enables accomplishment of an alignment system and/or a projection exposure apparatus by which simplification of baseline measurement control as well as improvement of baseline measurement precision and processing speed are assured.

Additionally, since a reticle patterning error component and a reticle measurement error component can be removed from a baseline measurement component, the baseline measurement can be performed without being affected by various reticle precisions. This is very effective to the enhancement of the baseline measurement precision.

As compared with conventional baseline measurement based on a calculation operation made to components of the three types of measurements, in accordance with these embodiments of the present invention, the baseline measurement value is obtainable with a calculation operation to two measurement components. This is very effective to improve calculation processing time, and also to reduce a measurement error related to various baseline measurement components.

Further, since the baseline measurement is performed by user of a parallel flat glass fixed to the apparatus, without relying on a reticle, the necessity of a reference reticle as required in conventional baseline measurement is removed.

Furthermore, because the baseline measurement can be done without a reticle, reticle replacement and baseline measurement can be performed in parallel. This is very effective to improve the throughput of the exposure apparatus.

In addition, use of an optical correcting mechanism for correcting optical influence due to absence of a reticle in an exposure apparatus, enables proper baseline measurement independently of whether there is a reticle loaded or not within the exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
    a projection system through which a substrate is exposed to a pattern of an original;
    a movable stage which holds the substrate;
    a mark member disposed at a predetermined position with respect to said projection system, said mark member having a first mark to which a first stage mark provided on said movable stage is to be aligned and a second mark to which an original mark provided on the original is to be aligned;
    a first position detecting system having a reference point, said first position detecting system detecting (i) a relative position between a second stage mark provided on said movable stage and the reference point and (ii)

a relative position between a substrate mark provided on the substrate and the reference point; and a second position detecting system which detects a relative position between the first stage mark and the first mark.

2. An apparatus according to claim 1, wherein a base line offset is determined on the basis of the relative position between the second stage mark and the reference point, and of the relative position between the first stage mark and the first mark.

3. An apparatus according to claim 2, wherein the substrate is aligned with respect to said projection system on the basis of the base line offset and of the relative position between the substrate mark and the reference point.

4. An apparatus according to claim 1, wherein said second position detecting system further detects a relative position between the original mark and the second mark.

5. An apparatus according to claim 1, wherein said mark member is provided between a position (i) where the original is to be disposed and (ii) said projection system.

6. An apparatus according to claim 1, wherein said second position detecting system has an optical system which adjusts an optical characteristic thereof on the basis of whether the original is present on a path thereof.

7. An apparatus according to claim 1, wherein said mark member includes a flat glass member.

8. An apparatus according to claim 1, wherein said mark member includes a central portion and a peripheral portion separated from the central portion, and having the first and second marks.

9. An apparatus according to claim 1, wherein said first position detecting system has a light path extending through said projection system.

10. A device manufacturing method, comprising the steps of:

exposing a substrate to a pattern of an original by use of an exposure apparatus as recited in claim 1; and developing the substrate exposed in said exposing step.

* * * * *

UNITED STATES PATENT AND TRADEMARK OFFICE
CERTIFICATE OF CORRECTION

PATENT NO. : 6,847,432 B2
DATED : January 25, 2005
INVENTOR(S) : Yuichi Osakabe et al.

It is certified that error appears in the above-identified patent and that said Letters Patent is hereby corrected as shown below:

Column 7,
Line 18, "glass" should read -- glass 3 --.

Column 8,
Line 56, "the X" should read -- the X, --

Column 9,
Line 42, "substate W." should read -- substrate W. --.

Column 10,
Line 37, "is as" should read -- are as --.

Column 11,
Line 34, "is as" should read -- are as --.

Column 14,
Line 33, "user" should read -- use --.

Signed and Sealed this

Nineteenth Day of July, 2005

JON W. DUDAS
*Director of the United States Patent and Trademark Office*